United States Patent [19]

Suzuki

[11] Patent Number: 5,048,968
[45] Date of Patent: Sep. 17, 1991

[54] ALIGNMENT MARK DETECTING OPTICAL SYSTEM

[75] Inventor: Akiyoshi Suzuki, Kanagawa, Japan

[73] Assignee: Canon Kabushiki Kaisha, Tokyo, Japan

[21] Appl. No.: 355,871

[22] Filed: May 23, 1989

Related U.S. Application Data

[63] Continuation of Ser. No. 143,232, Jan. 6, 1988, abandoned, which is a continuation of Ser. No. 808,379, Dec. 16, 1985, abandoned, which is a continuation of Ser. No. 541,066, Oct. 12, 1983, abandoned.

[30] Foreign Application Priority Data

Oct. 20, 1982 [JP] Japan .................. 57-184000

[51] Int. Cl.⁵ .............................. G01B 11/00
[52] U.S. Cl. .................................. 356/401
[58] Field of Search ............ 356/399, 400, 401; 350/173, 174

[56] References Cited

U.S. PATENT DOCUMENTS

| | | | |
|---|---|---|---|
| 3,355,979 | 12/1967 | Wirtanen | 356/399 |
| 3,652,163 | 3/1972 | Borkowski et al. | 350/174 |
| 3,684,384 | 8/1972 | Hojo et al. | 356/399 |
| 3,704,061 | 11/1972 | Travis | 350/174 |
| 3,751,170 | 8/1973 | Hidaka | 356/401 |
| 4,225,241 | 9/1980 | Dandliker | 356/400 |
| 4,251,129 | 2/1981 | Suzki et al. | 356/401 |
| 4,362,385 | 12/1982 | Lobach | 250/548 |
| 4,402,596 | 9/1983 | Kanatani | 356/401 |
| 4,474,469 | 10/1984 | Abe | 356/399 |
| 4,487,505 | 12/1984 | Nakano et al. | 356/401 |

FOREIGN PATENT DOCUMENTS 2211476 10/1972 Fed. Rep. of Germany .

OTHER PUBLICATIONS

Feder et al., "Mask to Wafer Alignment System", *IBM Technical Disclosure Bulletin*, vol. 16, No. 4, (Sep. 1973), p. 1307.

Primary Examiner—Richard A. Rosenberger
Attorney, Agent, or Firm—Fitzpatrick, Cella, Harper & Scinto

[57] ABSTRACT

In an alignment mark detecting optical system usable with an automatic alignment apparatus wherein alignment marks of a wafer and a mask are scanned by a laser beam to detect the state of misalignment therebetween, the laser beam scans the surface of the wafer opposed to the mask and the surface of the mask opposed to the wafer, i.e., the front face of the wafer and the back face of the mask. The light beams reflected by the surfaces are introduced to one or more photodetectors.

16 Claims, 4 Drawing Sheets

ALIGNMENT MARK DETECTING OPTICAL SYSTEM

This application is a continuation of application Ser. No. 07/143,232 filed Jan. 6, 1988 now abandoned, which is a continuation of application Ser. No. 06/808,379 filed on Dec. 16, 1985 now abandoned, which is a continuation of application Ser. No. 06/541,066 filed Oct. 12, 1983, now abandoned.

BACKGROUND OF THE INVENTION

1. Field of the Invention

The present invention relates to an alignment mark detecting optical system for detecting a state of misalignment between two objects to be aligned, more particularly an optical system for detecting the relative position between the two objects, such as a mask and a wafer, which are conjugate with respect to a projection lens, in an exposure and alignment apparatus for manufacturing semiconductor circuits.

2. Description of the Prior Art

The recent trends of higher operation speed and larger capacity of semiconductors constantly force to reduce the minimum projectable width of a line in a circuit pattern. As is well known, the semiconductor circuit elements are manufactured by superposing plural complicated patterns on a semiconductor substrate of Si or the like. One of the problems with the further miniaturization is how fine patterns can be projected on the substrate, and another problem is how accurate is the alignment between the patterns superposed. Generally, the accuracy of the alignment is required to be not more than 1/5–1/10 of the minimum line width of the circuit patterns. Therefore, it is not rare that the lack of accuracy of the alignment is fatal in the manufacture. The recent appearance of an automatic alignment mechanism which performs the alignment discussed above, automatically, is within this background. The automation alignment device has released the operators from simple and routine work and brought about the high speed, uniform quality and high precision alignment operation.

The major point in achieving a desirable automatic alignment device is how to detect the information to be processed. The electric processing of signals is not so flexible as in the case where an operator directly observes the objects and brings them into alignment. This is why various expedients are required in an observation optical system or an exposure optical system to provide better signal-to-noise ratio.

The mask, one of the objects to be aligned, has a relatively simple structure having a glass plate and a patterned thin layer of chromium or chrominum-chromium oxide. The wafer, however, has a complicated structure resulting from the plural superposed patterns and subsequent impurity diffusion and the other processing, so that the state of its surface widely varies. In addition, the wafer has on its surface a thin layer of photoresist whenever it is exposed to the mask pattern, and the thickness of the photoresist and the unevenness of its thickness influence the detection of the wafer signal.

In order to obtain a good signal-to-noise ratio in sensing the wafer which has the above described variable nature, many proposals have been made. One of such proposals is in Japanese Laid-open Patent Application 132851/1977 by the assignee or applicant of the present application. In this prior art, the object is scanned by a spot or slit of a laser beam which can provide a high brightness, and in order to increase the signal-to-noise ratio, only the scattered beam is picked up as the light to be directed to a photosensor. If this were applied, as it is, to an alignment scope wherein the wafer is observed through the mash, a problem would arise as to the interference of the laser beam. Particularly, the light directly scattered by the mask and the light returned, after the scattering, by way of the wafer, interfere with each other. The resultant signal is not constant with respect to time, which leads to unstable and unreliable measurement.

In order to avoid the occurrence of the undesirable interference, a proposal has been made in Japanese Laid-open Patent Application No. 24504/ 1981, wherein a projection optical system is disposed between the mask and the wafer, the projection optical system having therewithin an element corresponding to ¼ λ plate (a quarter wave plate) to separate the light directly reflected by the mask from the other light with the use of polarization. It is a serious limitation in the design of the projection optical system that an element corresponding to a λ/4 plate must be inserted therein. For those reasons, the conventional apparatus uses an interchangeable lens which has a λ/4 plate and which replaces a part of the projection lens at the time of alignment operation. As an alternative, a mirror in a projection optical system is provided with a special coating.

SUMMARY OF THE INVENTION

The principal object of the present invention is to eliminate the above described problems with the prior art.

The object of the present invention is to provide an alignment mark detecting optical system by which the opposed surfaces of the mask and wafer are directly illuminated, that is, the back face of the mask and the front face of the wafer are directly illuminated, and the beams reflected by the respective surfaces are introduced to a photoreceptor means. The term "directly" is intended to mean that the illumination beam or the reflected beam, after being reflected by one of the surfaces, is directed to a photoreceptor without reaching the other surface.

Another object of the present invention is to provide an alignment mark detecting optical system wherein the necessity of a λ/4 plate or the like inserted across the optical path of the image projection light in the projection optical system, is eliminated, and the signals from the mask and those from wafer can be separated.

A further object of the present invention is to provide an alignment mark detecting optical system wherein the limitation of the projection optical system to be color can be avoided, which limitation may be given by the difference in the wavelength between the image exposure light and the alignment light, so that the influence of the chromatic aberration of the projection optical system can be avoided.

A yet further object of the present invention is to provide an alignment mark detecting optical system which is matched to the nature of the projection optical system to take out the mask and wafer signals at high efficiency.

These and other objects, features and advantages of the present invention will become more apparent upon a consideration of the following description of the preferred embodiment of the present invention taken in conjunction with the accompanying drawings.

According to an embodiment of the present invention, the optical system has a polarization beam splitter disposed between the wafer and the mask.

DESCRIPTION OF THE PREFERRED EMBODIMENTS

Figure 1:
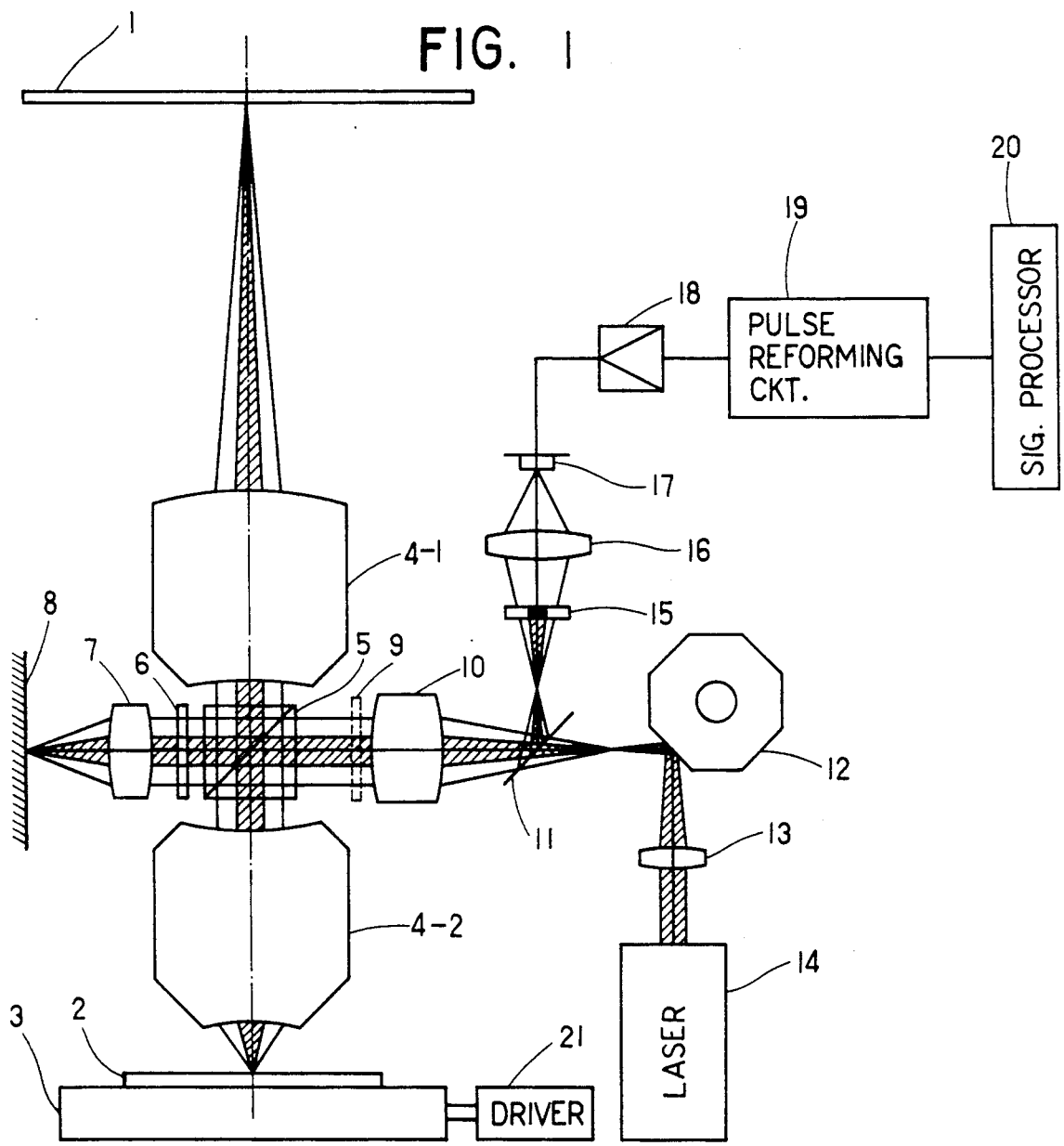
FIG. 1 shows an optical arrangement wherein the optical system according to an embodiment of the present invention is incorporated in an automatic aligner for a stepper.

An optical system according to an embodiment of the present invention will now be described in conjunction with FIG. 1, wherein the optical system is shown as being incorporated in an aligner for a step-and-repeat type alignment and exposure apparatus, a so-called stepper. A projection optical system, shown as consisting of the front lens group 4-1 and the rear lens group 4-2, projects an image of a mask or reticle 1 (hereinafter also called simply a "mask") onto a wafer 2 carried on a wafer stage 3 at a unit or reduced magnification. Between the lens group 4-1 and 4-2, a beam splitter 5 is disposed as a part of the projection optical system. The beam splitter 5, of which the function is dependent on the wavelength of the beam used, is so designed as to function as a polarization beam splitter for the alignment beam and function simply as a uniform thickness plate for the exposure beam, when the wavelength of the alignment beam is different from that of the exposure beam. When it can be deemed that there is no substantial difference in the wavelength, the element 5 functions as a beam splitter. It is convenient that the beam splitter 5 is disposed at, for example, the pupil of the projection optical system. FIG. 1 shows such a case.

The major components of the projection optical system are the lens groups 4-1 and 4-2 and the beam splitter 5 therebetween. According to this embodiment of the present invention, the alignment optical system is inserted at the position of the beam splitter 5. This is an important feature of this embodiment.

In this system, there is provided a laser source 14 for producing a laser beam, which is incident by way of a condenser lens 13 onto a polygonal mirror 12, which scanningly deflects the beam. The beam is then passed through a relay lens 10 and reaches the beam splitter 5. The beam is split into two beams by the beam splitter 5. If the laser source is of a polarization type, the direction of the polarization of the produced beam is to be predetermined, or otherwise, an element 9, such as a λ/4 or α/2 plate, for controlling the state of polarization, may be inserted, as shown in FIG. 1. Between the polygonal mirror 12 and the relay lens 10, another beam splitter 11 is provided to direct the beam to a photoelectric detection system, which will be described hereinafter. If a polarization type beam splitter is used for the beam splitter 11, the direction of the polarization of the beam incident on the relay lens 10 is determined accordingly. In this case, a λ/4 plate is used as the element 9 to control the state of polarization. As described hereinbefore, the beam splitter 5 is disposed at the pupil of the lens 4-1 and 4-2. The reflection point on the polygonal mirror 12 is conjugate with the pupil. The beam reflected by the beam splitter 5 is directed through the lens group 4-2 to the wafer 2 surface where the beam is imaged and scans the wafer 2 surface in accordance with the deflection by the polygonal mirror 12.

The relay lens 10 is effective to correct the aberration so as to form a spot of the beam on the wafer 2 surface through the lens group 4-2. The beam reflected by the wafer 2 is again reflected by the polarization beam splitter 5, and directed to the relay lens 10, thereafter directed by the beam splitter 15 to the photoelectric detection system including elements 15–17, among which element 15 is a spatial frequency filter for providing a dark field for the detection; element 16 is a condenser lens; and element 17 is a photodetector. The filter 15 is so disposed as to be conjugate with the reflection point of the polygonal mirror. The reflection point is fixed independently of the rotation of the polygonal mirror 12 so that the light beam specularly reflected by the wafer 2 is incident on the filter at a fixed point. The beam projected from the polygonal mirror 12 is indicated by the hatching. It is the same as with the Japanese Laid-open Patent Application No. 132851/1977 that the projected beam has the width smaller than the width with which the beam can pass through the optical system from the lens group 4-2 to the relay lens 10.

At the photoelectric detection system, only the scattered beam can be detected. The non-scattered beam, that is, the beam specularly or normally reflected by the wafer 2 traces back on the on-coming beam, that is, the specularly reflected beam is as wide as the hatched part of the on-coming beam, so that it is blocked by the spatial frequency filter 15. The beam reflected and scattered by the edges of the automatic alignment marks on the wafer 2 does not trace back, that is, it is directed in the area outside the hatched part. Thus, at the spatial filter 15, the scattered light and the non-scattered light are clearly separated spatially. The scattered light alone is allowed to pass the filter 15 and reach the photodetector 17.

The beam which is passed through the polarization beam splitter 5 is used for detecting the necessary information on the reticle or the mask 1. This will be described in detail. The beam, passed through the beam splitter 5, is introduced to a λ/4 plate 6 which changes the direction of the polarization of the beam after being reflected by a mirror 8. The beam reflected by the mirror 8 and changed in its direction of polarization by the λ/4 plate, is now reflected by the beam splitter 5 and directed through the lens group 4-1 to the back face of the mask 1, which is opposed to the wafer 2.

From the principle of laser beam scanning, it is understood that the beam must form a clear spot on the reticle or mask 1. This is provided by the lens 7 and the mirror 8. It is necessary that the lens 7 is a telecentric lens when the beam splitter 5 is at the pupil of the projection lens. The spot of the beam can be controlled by moving the mirror 8 along the optical axis of the lens 7.

The beam reflected by the mask 2 is then reflected by the beam splitter 5 to the mirror 8 through the λ/4 plate 6. The beam is reflected by the mirror 8 and again passed through the λ/4 plate 6. Because of the rotation of the polarization direction of the beam, the beam is now passed through the beam splitter 5 and directed to the photodetector 17 by way of the relay lens 10.

It can be said that the part of the optical system comprising the lens 7 and the mirror 8 forms a kind of cat's eye optical system. The cat's eye optical system is effective to form a spot of the laser beam on the reticle or mask 1 through the lens group 4-1 of the projection optical system. Thus, it becomes possible that the laser beam spot can be formed on each of the mask 1 and the wafer 2.

When the projection optical system including lens groups 4-1 and 4-2 is designed to match the exposure light, for example, g radiation (wavelength is 436 nm), the alignment beam generated by He-Ne laser source (633 nm) would generally result in the great difference in the chromatic aberration therebetween. Therefore, if the beam of g radiation is focused on the mask 1 and the wafer 2, the beam of 633 nm wavelength is greatly defocused on the wafer. However, according to this embodiment of the present invention using the optical elements 7 et seq., the sharp spots can be formed both on the mask 1 and wafer 2 with the beam of 633 nm wavelength, without defocusing the beam of the g radiation.

The beam from the reticle or mask 1 is detected by the scattered beam, too. This will be readily understood from the hatched area of the beam. The scattered beam signals from the mask 1 and the wafer 2, when they are scanned by the deflection by the polygonal mirror 12, are detected by the photodetector 17. The output of the photodetector 17 is introduced through the amplifier 18 and the pulse reforming circuit 19 to the signal processing system 20. In response to the output of the signal processing system 20, the relative position between the mask 1 and the wafer 2 is changed by, for example, a wafer driver 21.

Instead of the wafer 2, the reticle or mask 1 can be moved. In this case, the accuracy of the movement is less severe corresponding to the magnification.

It should be noted that the optical system of this embodiment detects the wafer 2 and the mask 1 substantially independently from each other so that there is no interference between the beam for the wafer 2 and the beam for the mask 1. Therefore, the obtained signals are very stable so that high accuracy of the detection can be separately obtained. This stability is the advantageous effect peculiar to the present invention, and applies to all of the embodiments which will be described hereinafter.

Figure 2:
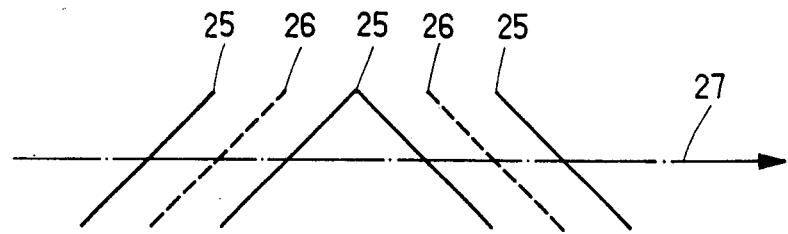
FIG. 2 shows an example of alignment marks used with the present invention.

As for the alignment marks, those shown in FIG. 2 are known. The mask 1 has the marks 25, and the wafer 2 has the marks 26 shown by broken lines. The marks 25 and 26 are scanned by a laser beam along a scanning line 27. The images of the marks on the mask 1 and the wafer 2 are observed as those superposed in the manner shown in FIG. 2. The scattered beam is detected when the beam is incident on the marks 25 and 26. The result of the detection is converted to a series of electric pulses. By measuring the time intervals between the pulses, the relative position between the mask 1 and the wafer 2 can be detected.

Figure 3:
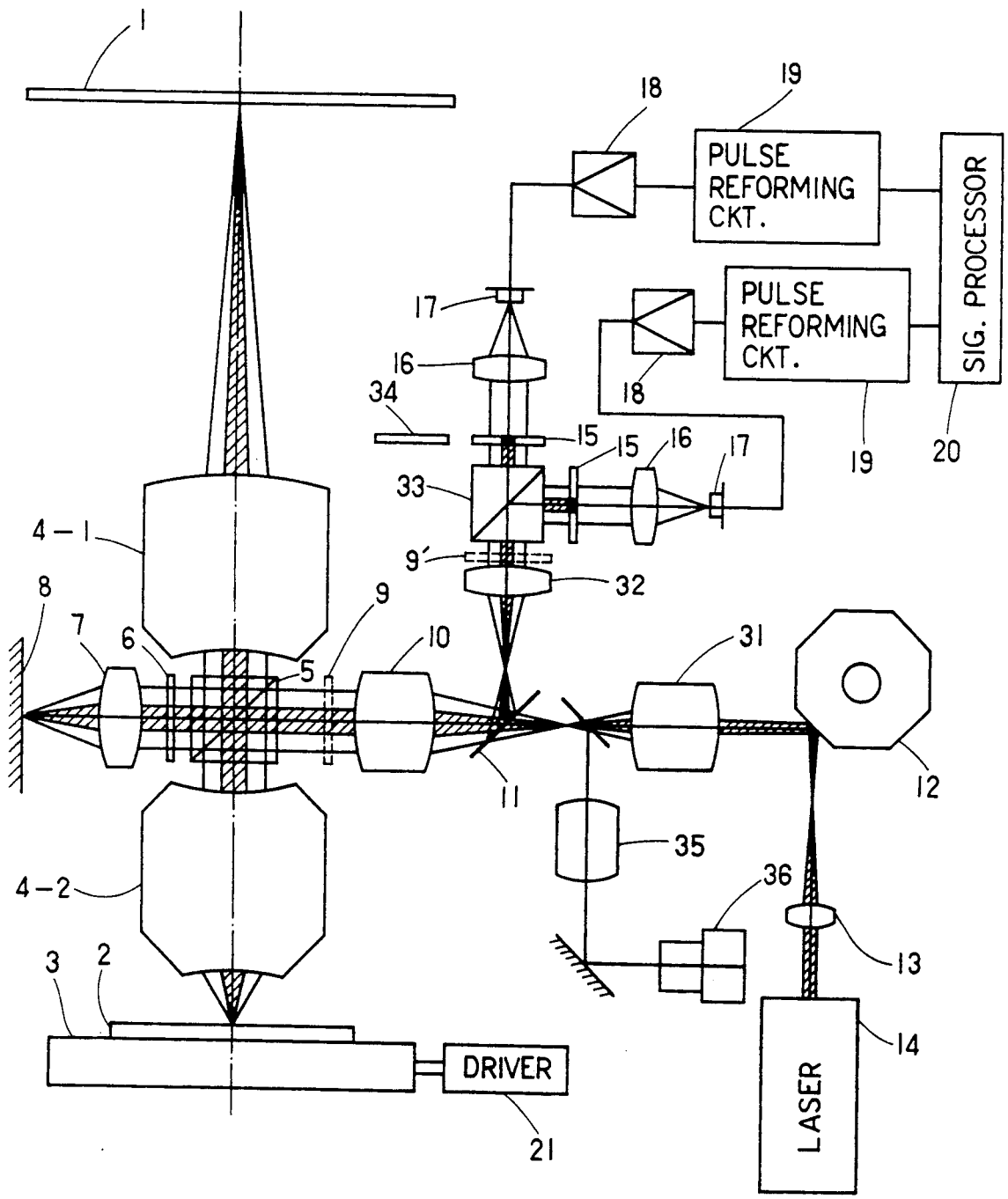
FIG. 3 shows an optical arrangement wherein the optical system according to another embodiment of the present invention is incorporated in an automatic aligner for a stepper.

FIG. 3 shows another embodiment of the present invention, which is different from FIG. 1 embodiment in that a relay lens 31 is used because the state of the laser beam used is different, and in that the structure of the photoelectric detection system is different. In the system of FIG. 3, the wafer 2 is scanned through the lenses 31, 10, 4-2, and the mask 1 scanned through the lenses 31, 10, 7, 7, 4-1. Both of them are desirably have so-called f-θ characteristics, that is, the characteristics by which the scanning spot moves on the surface to be scanned at a speed which is uniform throughout the scanning area. The imaging relations of the spot are shown in FIG. 3 wherein the hatched area shows the effective beam diameter of the laser beam as in the FIG. 1 embodiment.

What is different from FIG. 1 embodiment is in the photoelectric detection system downstream of the beam splitter 11. The detection system includes a pupil imaging lens 32, a polarization beam splitter 33, a spatial frequency filters 15 and 15, condenser lenses 16 and 16 and photodetectors 17 and 17.

It should be noted that the two beams, from the mask 1 and the wafer 2, which are combined thereafter by the beam splitter 5, have different directions of polarization, i.e., orthogonal. In view of this the beam splitter 33 is used.

The polarization of the beam incident on the polarization beam splitter 5 must be such that it contains both of P and S components, so that it can be divided into the beam to the mask 1 and the beam to the wafer 2. If a polarization type laser beam generator is used, the direction of the polarization of the output beam may be suitably predetermined. Instead, it is possible to utilize a λ/4 plate 9 to provide a beam containing P and S components. In such a case, an additional λ/4 plate 9' is necessary. In any event, the beam combined back to a single beam by the beam splitter 5 bears two pieces of information, one being the information of the wafer 2 as a beam polarized in a certain direction and the other being the information of the mask 1 as a beam polarized in the orthogonal direction. The photoelectric detection system of FIG. 3 is intended to separate them again into the respective signals which are electrically processed separately. In this case, the beam from the mask 1 may be detected in a light field since the object consists of a glass and chromium or chromium oxide which are quite different in their reflection factors. In order to provide the light field, the associated spatial frequency filter 15 may be replaced with a transparent glass 34, or otherwise, the filter 15 may simply be removed. The beam from the wafer 2 is desirably detected in the dark field, on the contrary, because of the better signal-to-noise ratio. The quantity of light detected in the dark field is less than that in a light field by one order. It is possible, if the beam from the mask 1 is detected in a light field, that the ratio of the P-polarization component to the S-polarization component in the beam first incident on the polarization beam splitter, is so controlled by, for example, changing the polarization direction of the laser beam generated, that the wafer 2 receives a higher quantity of light. Even if the light field output of the wafer 2 varies because of the thickness variations of the photoresist, the separation by the polarization is effective to keep the stability of the light field output of the reticle or mask 1.

The system of FIG. 3 further includes an erector 35 and eye piece 36 to form an observation optical system for the mask 1 and wafer 2. The observation optical system is desirable for the operation of the apparatus. However, for the sake of simplicity of explanation, such optical system is shown only in FIG. 3, and omitted from FIG. 1 and in FIG. 4 which will be described in the following paragraphs.

Figure 4:
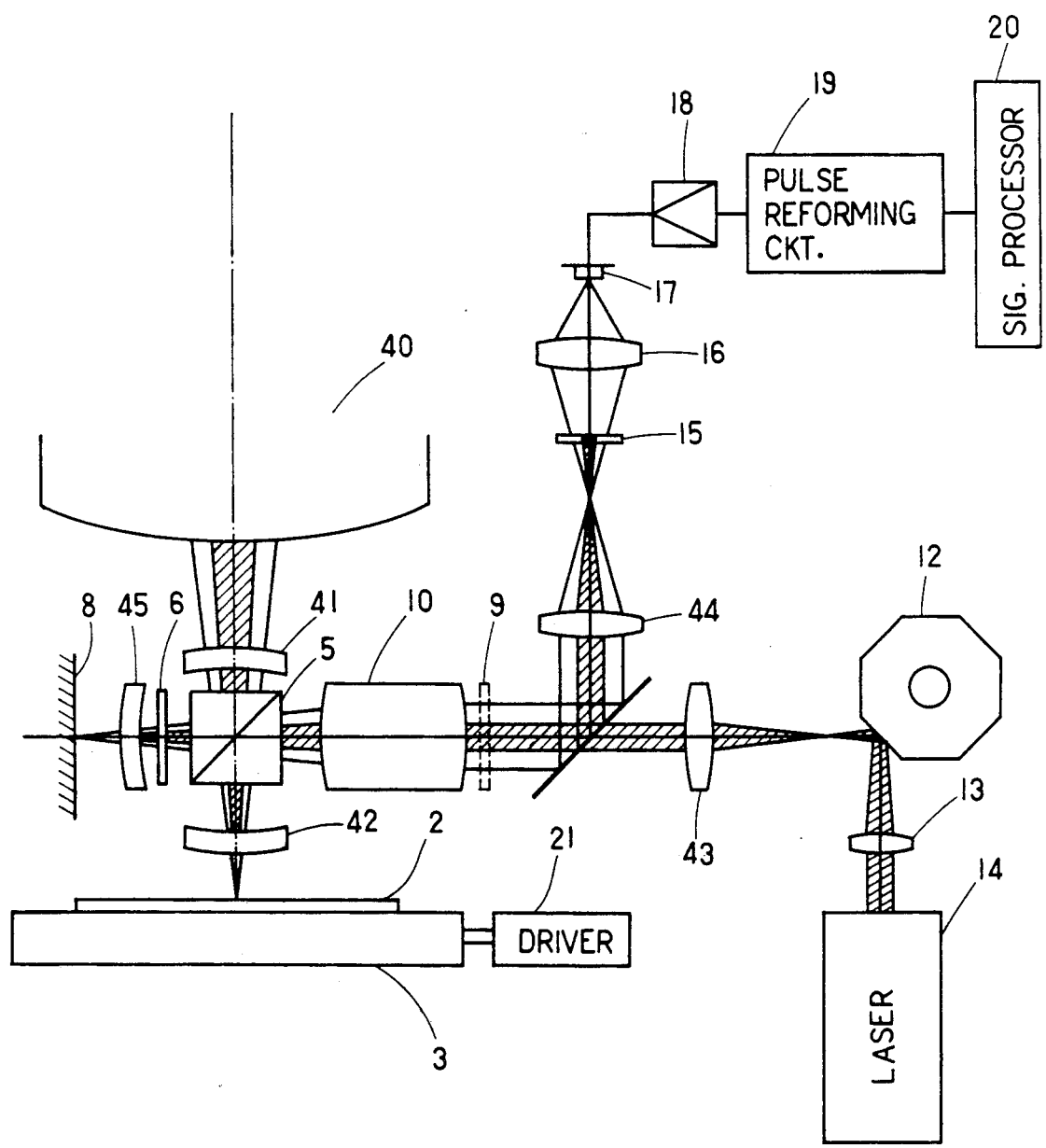
FIG. 4 shows an optical arrangement of the optical system according to a further embodiment of the present invention.
Figure 5:
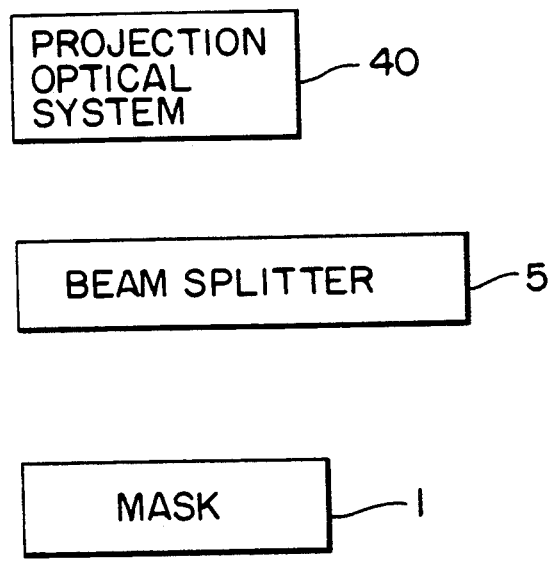

FIG. 4 shows a further embodiment of the present invention wherein an observation optical system comprising elements 41, 5 and 42 is inserted between the projection optical system 40 and the wafer 2. The optical elements 41, 5 and 42 are insertion optical elements each having a unit magnification so that the state of focus and the imaging magnification do not change by the insertion of those elements. It is desirable in this case also that a polarization beam splitter 5 is used. The functions of the λ/4 plate 6, correction lens 45 and the reflection mirror 8 are the same as with the FIGS. 1 and 3 embodiments.

This embodiment is advantageous in that the wafer 2 can be directly observed, i.e., not via projection optical system 40. Even if the NA (numerical aperture) of the projection optical system is small, a high accuracy of alignment may be required. In such a case, it is the problem that the wafer is observed at as high as possible resolution. This is because the mask pattern is easy to observe due to its sharpness at the pattern edges, whereas the wafer 2 is complicated in its structure. In this embodiment, the NA of the observation optical system can be selected independently of the NA of the projection optical system so that the diameter of the scanning spot can be made smaller than when the wafer 2 is observed through the projection optical system 40. The reduction of the scanning spot diameter corresponds to the increase of the NA of the scanning spot. If the NA of the scanning spot is increased without changing the NA of the projection optical system which is determined as a whole of the system, it cannot be afforded to take out the scattered beam, thus decreasing the output of the photoelectric detector. Referring to FIG. 4, this corresponds to the increase of the hatched area and the decrease of the unhatched area of the entire beam. Therefore, the system which directly observes the wafer 2 is advantageous, since it can observe the wafer 2 with its NA larger than that of the projection optical system 40.

Also, this embodiment is advantageous particularly when the transmission factor of the projection optical system 40 is not so high, because the wafer 2 which is difficult to observe, is observed directly without degrading by the relatively low transmission factor. The beam from the mask or reticle 1 is once reflected by the mirror 8 and then reflected by the polarization beam splitter due to the function of λ/4 plate 6. Then, the beam is directed through the projection optical system 40 to an unshown mask 1 where it is reflected and scattered and returned. This embodiment uses a pupil imaging lens 44 and spatial frequency filter 15 to provide a structure similar to the FIG. 1 embodiment, but another structure, i.e., similar to the FIG. 3 embodiment is possible. Since the signal-to-noise ratio of the scattered beam from the mask 1 is better, a satisfactory signal can be obtained by the structure of FIG. 4.

Another possible example is the polarization beam splitter disposed between the reticle or mask 1 and the projection optical system. The detailed explanation is omitted since the optical system of FIG. 4 can be used as it is.

The present invention is not limited to the laser beam scanning type, but is usable with other automatic alignment methods such as those using a TV or an image sensor.

Although the beam splitter 5 has been described as functioning first to split the oncoming beam toward the mask 1 and wafer and second to direct the beams deflected thereby to the photoreceptor 17, two beam splitters in place of the beam splitter 5 may be used for performing the first and second functions respectively. In FIG. 1 embodiment, for example, an additional set of the relay lens 10, the beam splitter 5, the λ/4 plate, the lens 7 and mirror 8 is inserted right above the existing set. The additional set functions to direct the reflected beams to the photoreceptor 17, while the existing set functions only to direct the beam from the polygonal mirror 12 to the mask 1 and wafer 2. It will readily be understood that the beam splitter 11 not necessary.

As described above, the present invention wherein the polarization beam splitter is disposed between the mask 1 and the wafer 2, and the reference surface 8 is associated therewith, simultaneously eliminates the limitations involved in the prior art systems.

The present invention is effective to remove the influence of the chromatic aberration difference between the alignment beam and the exposure beam. The focusing with the alignment beam is possible without changing the relation of the mask 1 and the wafer 2 which are optically conjugate. The wavelength of the alignment beam can be less limitedly selected.

Further, according to the present invention, there is no interference between the mask beam and the wafer beam so that they can be picked up independently from each other so that a stable and reliable measurement is made possible with the improvement in the accuracy of detection.

According to another aspect of the present invention, the wafer can be directly observed with a larger NA. The system which can remove the limitation by the NA of the projection optical system, is effective to improve the accuracy of the automation alignment.

According to a further aspect of the present invention, the arrangement can be made to meet the transmission factor of the projection optical system. It was made possible to use a projection optical system exhibiting a low transmission factor for the alignment beam.

While the invention has been described with reference to the structures disclosed herein, it is not confined to the details set forth and this application is intended to cover such modifications or changes as may come within the purpose of the improvements or the scope of the following claims.

What is claimed is:

1. A projection exposure apparatus, comprising:
   a projection optical system through which an image of a pattern of a first article is projected on a second article;
   a polarization beam splitter disposed in an optical path of the projection optical system;
   an auxiliary optical system disposed outside the optical path, the auxiliary optical system including a mirror and a λ/4 plate disposed between the mirror and the polarization beam splitter;
   means for illuminating the first and second articles, wherein said illuminating means directs a beam to said beam splitter, which splits the beam into two beams, one of which is directed to one of the first and second articles and the other of which is directed to the other of the articles with said auxiliary optical system and said beam splitter, wherein said mirror of said auxiliary optical system receives the other beam from said beam splitter through said λ/4 plate and reflects said other beam to be incident on said beam splitter through said λ/4 plate, by which the other beam is directed to the other article through said beam splitter, and wherein at least one of the beams is incident on the associated one of the articles through at least a part of said projection optical system, wherein said illuminating means includes a laser source for producing the beam comprising a laser beam and a rotational mirror for receiving and reflecting the laser beam which is produced by said laser source, and wherein the first and second articles are scanned with the laser beam by rotation of said rotational mirror; and means for detecting a positional relation between the first and second articles using the beam, wherein said detecting means receives through said polarization beam splitter said one of the beams reflected by said one of the articles and receives through said polarization beam splitter and through said auxiliary optical system the beam reflected by the other one of the articles.

2. An apparatus according to claim 1, wherein a beam reflecting position of said rotation mirror and a pupil of said projection optical system are optically conjugate, and wherein said beam splitter is disposed adjacent the pupil of said projection optical system.

3. An apparatus according to claim 2, wherein said detecting means includes first and second photo-detectors, said first photodetector receiving a beam from one of the articles, and said second photo-detector receiving a beam from the other of the articles.

4. An apparatus according to claim 3, wherein said detecting means further include first and second spatial filters which are disposed in an optically conjugate relation with a pupil of said projection optical system, and wherein said first photo-detector receives through said first spatial filter the light scattered by a mark formed on said one of the articles, and wherein said second photo-detector receives through said second spatial filter the light scattered by a mark formed on said other one of the articles.

5. An apparatus according to claim 2, wherein said detecting means includes a spatial filter disposed in an optically conjugate relation with a pupil of said projection optical system, and wherein said photo-detector receives through said spatial filter the light scattered by marks formed on the first and second articles.

6. A projection exposure apparatus, comprising:

a projection optical system through which an image of a pattern of a first article is projected on a second article;

a polarization beam splitter disposed in an optical path of the projection optical system;

an auxiliary optical system disposed outside the optical path, the auxiliary optical system including a mirror and a λ/4 plate disposed between the mirror and the polarization beam splitter;

means for illuminating the first and second articles, wherein said illuminating means directs a beam to said beam splitter, which splits the beam into two beams, one of which is directed to one of the first and second articles and the other of which is directed to the other of the articles with said auxiliary optical system and said beam splitter, wherein said mirror of said auxiliary optical system receives the other beam from said beam splitter through said λ/4 plate and reflects said other beam to be incident on said beam splitter through said λ/4 plate, by which the other beam is directed to the other article through said beam splitter, and wherein at least one of the beams is incident on the associated one of the articles through at least a part of said projecting optical system; and means for detecting a positional relation between the first and second articles using the beams, wherein said detecting means receives through said polarization beam splitter said one of the beams reflected by said one of the articles and receives through said polarization beam splitter and through said auxiliary optical system the beam reflected by the other one of the articles, wherein said auxiliary optical system further includes a lens system disposed between said mirror and said beam splitter.

7. An apparatus according to claim 6, wherein said illuminating means illuminates the first and second articles with a beam having a wavelength different from that for the projection of the image of the pattern from the first article to the second article.

8. An apparatus according to claim 6, wherein said beam splitter is disposed adjacent a pupil of said projection optical system.

9. An apparatus according to claim 8, wherein the lens system of said auxiliary optical system is a telecentric system.

10. An apparatus according to claim 6, wherein said beam splitter is disposed between said projection optical system and the first article.

11. An apparatus according to claim 6, wherein said mirror is movable along an optical axis of said lens.

12. An apparatus according to claim 6, wherein said lens and said mirror constitute a cat's eye optical system.

13. An apparatus according to claim 6, wherein said beam splitter functions as a parallel plane plate for the projection of the image of the pattern from the first article to the second article.

14. An apparatus according to claim 6, wherein said beam splitter is disposed between said projection optical system and the second article.

15. An apparatus according to claim 6, wherein said detecting means includes an image sensor for picking up images of the first and second articles with the reflected beams.

16. An apparatus according to claim 6, wherein said detecting means includes a television camera for picking up images of the first and second articles with the reflected beams.

* * * * *

UNITED STATES PATENT AND TRADEMARK OFFICE
CERTIFICATE OF CORRECTION

PATENT NO. : 5,048,968
DATED : September 17, 1991
INVENTOR(S) : AKIYOSHI SUZUKI

It is certified that error appears in the above-identified patent and that said Letters Patent is hereby corrected as shown below:

COLUMN 2

Line 7, "mash," should read --mask,--.

COLUMN 8

Line 9, "splitter 11" should read --splitter 11 is--.

COLUMN 9

Line 11, "beam," should read --beams,--.
Line 19, "rotation mirror" should read --rotational mirror--.

Signed and Sealed this

Second Day of March, 1993

Attest:

STEPHEN G. KUNIN

Attesting Officer

Acting Commissioner of Patents and Trademarks